US011112452B2

(12) United States Patent
Hayashida

(10) Patent No.: US 11,112,452 B2
(45) Date of Patent: Sep. 7, 2021

(54) IC TRAY AND TEST JIG

(71) Applicants: Kabushiki Kaisha Toshiba, Tokyo (JP); Toshiba Electronic Devices & Storage Corporation, Tokyo (JP)

(72) Inventor: Akihiro Hayashida, Chiba Chiba (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 111 days.

(21) Appl. No.: 16/557,172

(22) Filed: Aug. 30, 2019

(65) Prior Publication Data

US 2020/0284833 A1 Sep. 10, 2020

(30) Foreign Application Priority Data

Mar. 7, 2019 (JP) .............................. JP2019-041604

(51) Int. Cl.
*G01R 31/28* (2006.01)

(52) U.S. Cl.
CPC ..... *G01R 31/2867* (2013.01); *G01R 31/2868* (2013.01); *G01R 31/2887* (2013.01); *G01R 31/2893* (2013.01); *G01R 31/2896* (2013.01)

(58) Field of Classification Search
CPC ............ G01R 31/2867; G01R 31/2868; G01R 31/2887; G01R 31/2893; G01R 31/2896; G01R 31/26; G01R 31/2874; G01R 31/2891; G01R 1/0433; G01R 1/0458; G01R 31/2886; G01R 13/00; G01R 1/0466; G01R 1/06766; G01R 31/2829; G01R 31/2831; G01R 31/2851; G01R 31/2865; G01R 31/2884; G01R 31/2889; G01R 31/308; H01R 33/97; H01R 33/76; H01L 21/66; G05B 19/4184; G05B 2219/33331; H04B 17/29; H05K 3/4038
See application file for complete search history.

(56) References Cited

U.S. PATENT DOCUMENTS

| | | | | |
|---|---|---|---|---|
| 5,177,434 A * | 1/1993 | Suzuki | ..................... | G01R 1/04 198/395 |
| 5,227,717 A * | 7/1993 | Tsurishima | .............. | G01R 1/04 324/754.11 |
| 5,894,217 A * | 4/1999 | Igarashi | ............... | G01R 1/0408 324/750.25 |
| 9,638,747 B2 * | 5/2017 | Diglio | .................. | G01R 1/0466 |

FOREIGN PATENT DOCUMENTS

| JP | 09-040068 | | 2/1997 |
|---|---|---|---|
| JP | 3566928 | B2 | 9/2004 |
| JP | 2006-298397 | A | 11/2006 |
| JP | 2011-046408 | A | 3/2011 |

* cited by examiner

*Primary Examiner* — Vinh P Nguyen
(74) *Attorney, Agent, or Firm* — White & Case LLP

(57) ABSTRACT

According to one embodiment, an IC tray mounting thereon IC packages to be tested includes a plurality of through-holes provided at a pitch equal to a pitch of terminals of the IC packages, and IC package mounting places on which the IC packages are to be mounted. The through-holes are provided in the IC package mounting places correspondingly to arrangement positions of the terminals of the IC packages. The IC package mounting places are provided correspondingly to a region of a test board where a plurality of test pins used for an electrical test to one of the IC packages are arranged.

6 Claims, 10 Drawing Sheets

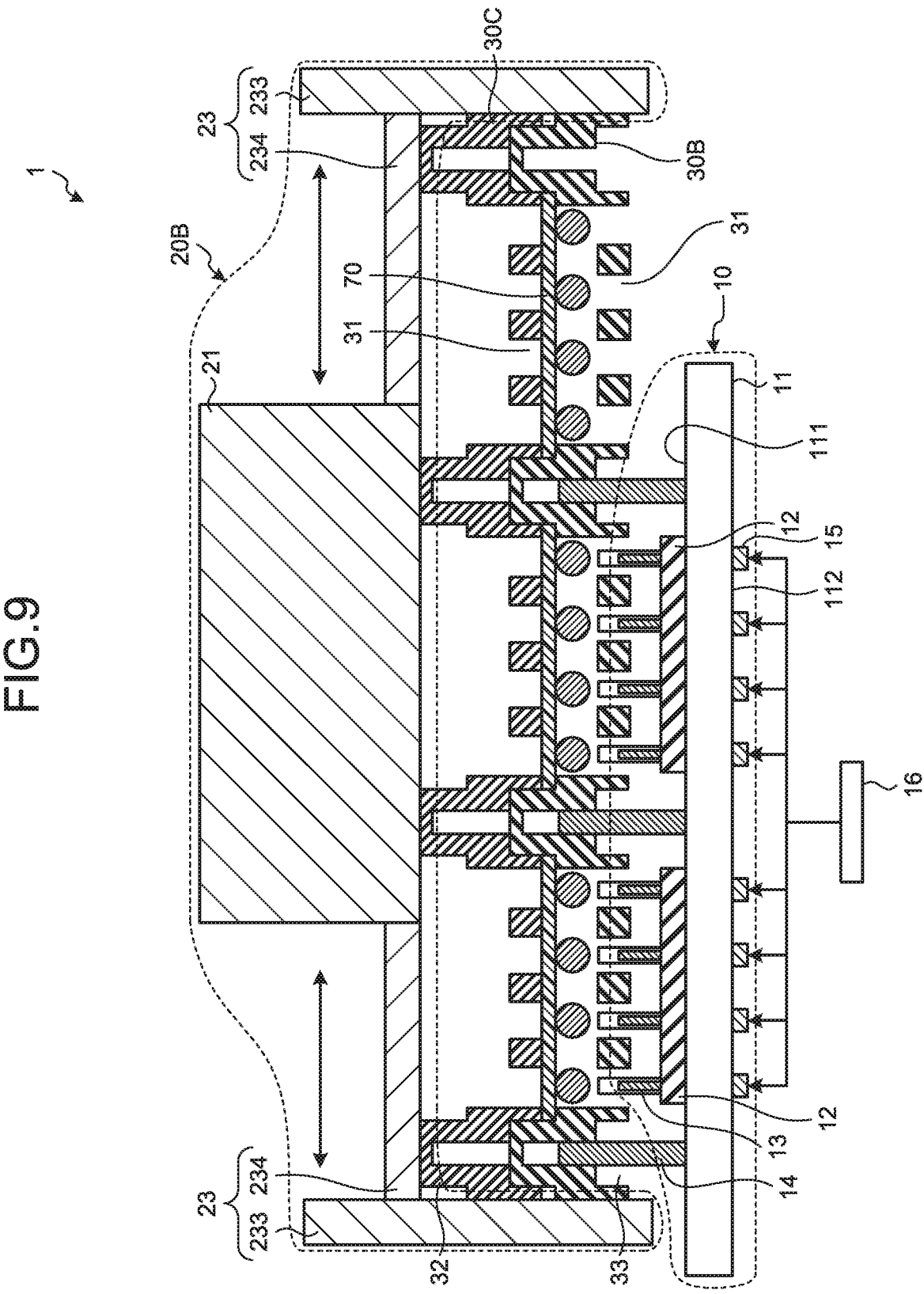

IC TRAY AND TEST JIG

CROSS-REFERENCE TO RELATED APPLICATIONS

This application is based upon and claims the benefit of priority from Japanese Patent Application No. 2019-041604, filed on Mar. 7, 2019; the entire contents of which are incorporated herein by reference.

FIELD

Embodiments described herein relate generally to an IC tray and a test jig.

BACKGROUND

An Integrated Circuit (IC) package is transferred to an IC socket by a handler, and is attached to the IC socket, and then an electrical test is performed to the IC package. IC packages to be tested are placed on a tray, and are transferred to the IC socket one by one by the handler.

In the handler, a connection component including a chucking mechanism is used to transfer an IC package. Here, the connection component differs depending on the specifications of the IC package, such as the size and/or thickness. Accordingly, as the number of types of specifications of the IC package becomes larger, the number of corresponding connection components increases.

BRIEF DESCRIPTION OF THE DRAWINGS

FIG. 9 is a diagram schematically illustrating a configuration example of a test jig including an IC tray according to a third embodiment;

DETAILED DESCRIPTION

In general, according to one embodiment, an IC tray mounting thereon IC packages to be tested includes a plurality of through-holes provided at a pitch equal to a pitch of terminals of the IC packages, and IC package mounting places on which the IC packages are to be mounted. The through-holes are provided in the IC package mounting places correspondingly to arrangement positions of the terminals of the IC packages. The IC package mounting places are provided correspondingly to a region of a test board where a plurality of test pins used for an electrical test to one of the IC packages are arranged.

Exemplary embodiments of an IC tray and a test jig will be explained below in detail with reference to the accompanying drawings. The present invention is not limited to the following embodiments.

First Embodiment

Figure 1:
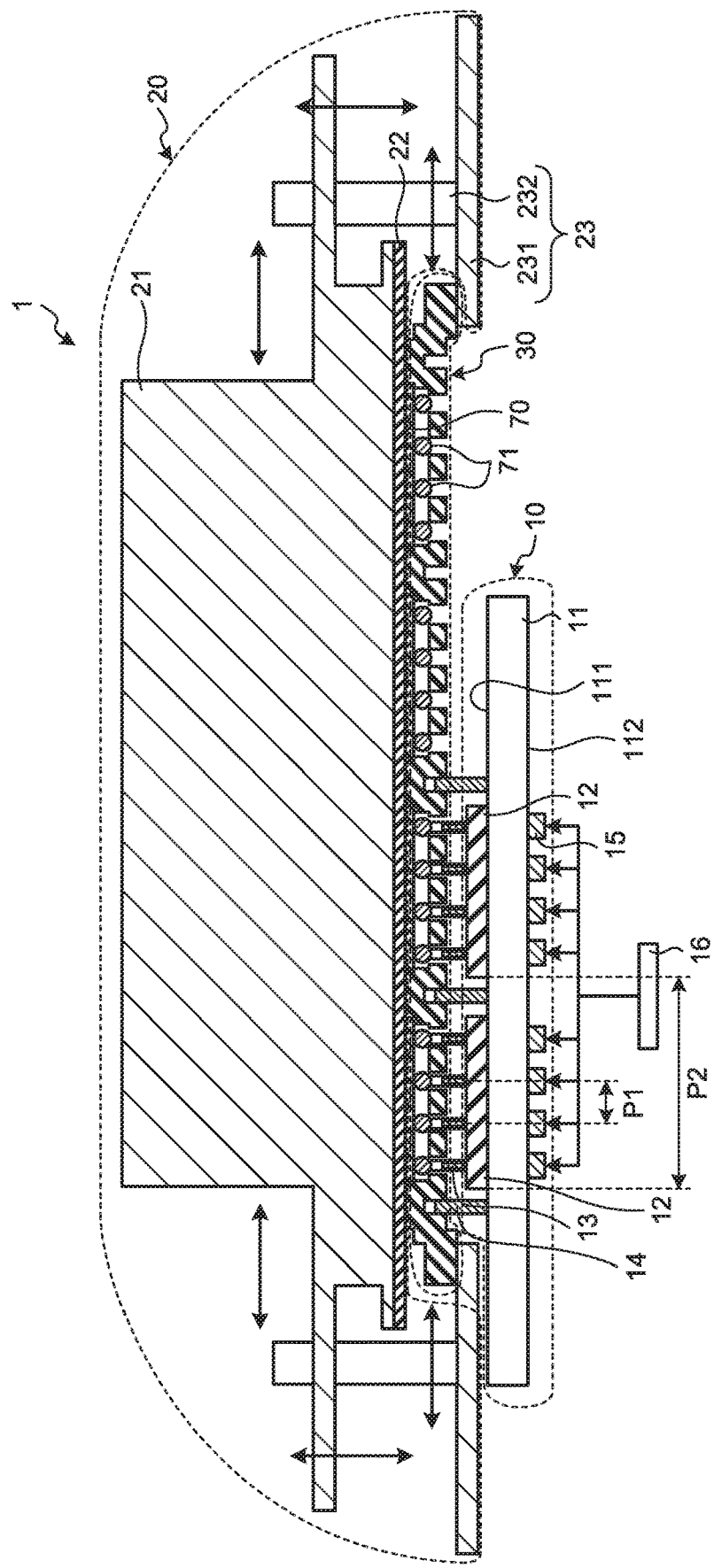
FIG. 1 is a diagram schematically illustrating a configuration example of a test jig including an IC tray according to a first embodiment.

FIG. 1 is a diagram schematically illustrating a configuration example of a test jig including an IC tray according to a first embodiment. The test jig 1 includes a test board 10, a tray transfer mechanism 20, and an IC tray 30. Hereinafter, it is assumed that the test board 10 is placed in a horizontal plane.

The test board 10 includes a base plate 11 provided with wiring lines (not illustrated) arranged thereon. The base plate 11 is further provided with support tables 12 on the upper face 111, and test pins 13 are arranged at predetermined positions on the support tables 12. In this example, the support tables 12 are provided for respective ones of test object IC packages 70. The test pins 13 of each of the support tables 12 are arranged in accordance with the positions of the terminals 71 of one IC package 70 to be tested. As each of the test pins 13, for example, a spring pin is used.

The respective test pins 13 are connected to a tester channel 16 of a tester through wiring lines (not illustrated) and electrode pads 15 on the lower face 112 of the base plate 11. Further, the wiring lines are arranged in a state connected to the electrode pads 15 on the lower face 112 through the upper face 111 of the base plate 11 and an inner layer of the base plate 11. The wiring lines include signal lines, power lines, ground lines, and so forth. The tester channel 16 connected to the respective electrode pads 15 is supplied with a signal, an electric power, and so forth, in accordance with a test program determined for every type of IC package 70.

The base plate 11 is provided with guide pins 14 arranged at predetermined positions on the upper face 111. The guide pins 14 are provided to perform alignment between the test board 10 and the IC tray 30 transferred by the tray transfer mechanism 20. The guide pins 14 are preferably arranged around the support tables 12.

The tray transfer mechanism 20 can hold the IC tray 30 including IC packages 70 mounted thereon, and transfer the IC tray 30 to the test board 10 to bring the terminals 71 of the IC packages 70 into contact with the test pins 13. The tray transfer mechanism 20 may also be referred to as "handler".

The tray transfer mechanism 20 includes a head 21, a pad 22, and gripping members 23. The head 21 is configured to come into contact with the upper face of the IC tray 30 through the pad 22. When the IC tray 30 includes IC packages 70 mounted thereon, the head 21 comes into contact with the upper face of the IC tray 30 and the upper faces of the IC packages 70 through the pad 22. The head 21 is configured to be movable in the vertical direction, and further movable in the respective directions in a horizontal plane. The pad 22 is a member for pressing the upper faces of the IC packages 70 mounted on the IC tray 30 during a test. The pad 22 is made of a material with elasticity, for example.

The gripping members 23 are connected to the head 21, and are configured to grip the IC tray 30. In this example, the gripping members 23 hold the lower face side of the peripheral portion of the IC tray 30 in a state where the upper face of the IC tray 30 is in contact with the pad 22. Each of the gripping members 23 includes a holding portion 231 for holding the lower face side of the IC tray 30, and an arm 232 through which the holding portion 231 is supported by the head 21. The arm 232 is configured to allow the holding portion 231 to move in the vertical direction and the horizontal direction. The arm 232 fixes the holding portion 231 to secure the IC tray 30 between the head 21 and the holding portion 231.

Figure 2A:
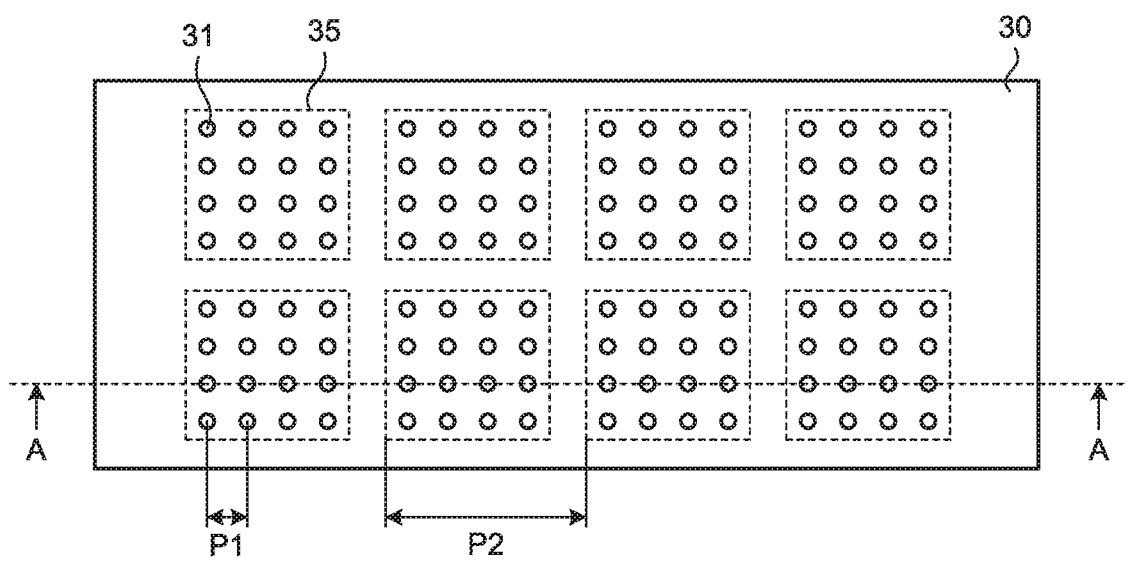
FIGS. 2A and 2B are diagrams illustrating a configuration example of the IC tray according to the first embodiment.
Figure 2B:
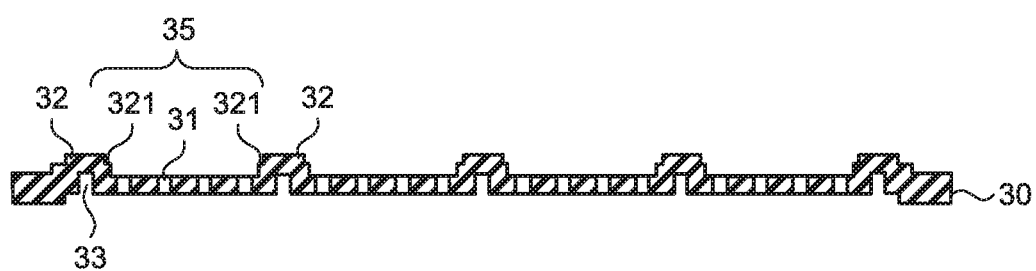

The IC tray 30 is a member on which a plurality of IC packages 70 can be mounted. FIGS. 2A and 2B are diagrams illustrating a configuration example of the IC tray according to the first embodiment. FIG. 2A is a top view, and FIG. 2B is a sectional view taken along a line A-A of FIG. 2A. The IC tray 30 is provided with through-holes 31 that penetrate therethrough in the thickness direction. The through-holes 31 are provided in accordance with the arrangement of the terminals 71 of test object IC packages 70. For example, where the IC packages 70 are of the type with a Ball Grid Array (BGA), the through-holes 31 are provided in accordance with the pitch P1 of solder balls serving as the terminals 71.

The through-holes 31 are provided in accordance with the positions of the support tables 12 on the test board 10. In the example of FIG. 1, each of the support tables 12 is used to test one IC package 70. Accordingly, the through-holes 31 are arranged correspondingly to the positions of the support tables 12 on the test board 10. In the example of FIG. 2A, the IC tray 30 includes IC package mounting places 35 for mounting IC packages 70 thereon. The IC package mounting places 35 correspond to the arrangement positions of the support tables 12 on the test board 10. Thus, the pitch P2 of the IC package mounting places 35 on the IC tray 30 is equal to the pitch P2 of the support tables 12 on the test board 10. Further, in each of the IC package mounting places 35, through-holes 31 are provided in accordance with the arrangement positions of the terminals 71 of an IC package 70. The pitch P1 of the through-holes 31 is equal to the pitch P1 of the terminals 71 of the IC package 70. It suffices that the diameter of each through-hole 31 is larger than the diameter of each test pin 13. The diameter of each through-hole 31 is preferably set to a size that can accommodate each terminal 71 of the IC package 70. In a state where the terminals 71 are accommodated in the through-holes 31, the IC package 70 is stably mounted on the IC tray 30.

The IC tray 30 is provided with protruding portions 32 on the upper face, which demarcate the IC package mounting places 35. The size between the opposite lateral sides of protruding portions 32 arranged adjacent to each other is the size of each IC package mounting place 35 in the horizontal direction, and is equal to the size of one IC package 70 in the horizontal direction. The protruding portions 32 are provided with a step on the lateral sides facing each IC package mounting place 35. The step includes a flat portion serving as a terrace that is used as a support portion 321 to support the peripheral portion of each IC package 70. The position of the support portion 321 in the thickness direction is preferably set to allow the terminals 71 to be fitted in the through-holes 31.

Figure 3A:
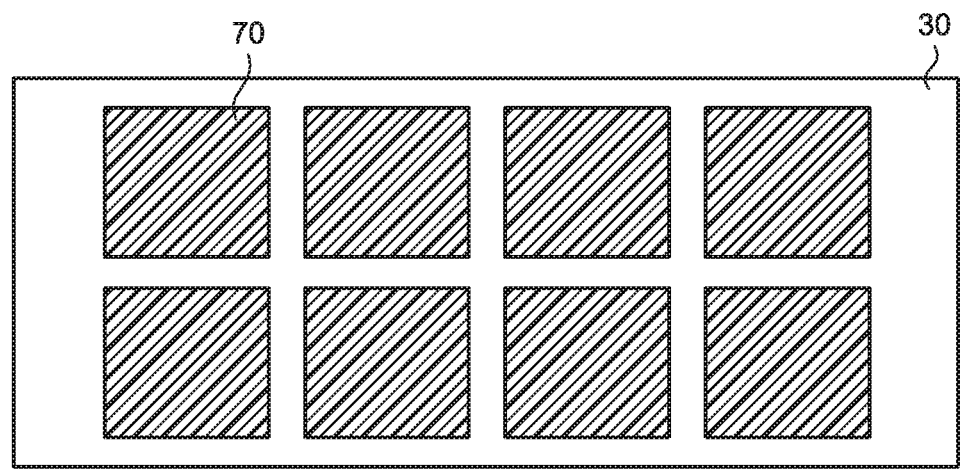
FIGS. 3A and 3B are diagrams illustrating an example of the IC tray in a state where IC packages are mounted thereon.
Figure 3B:
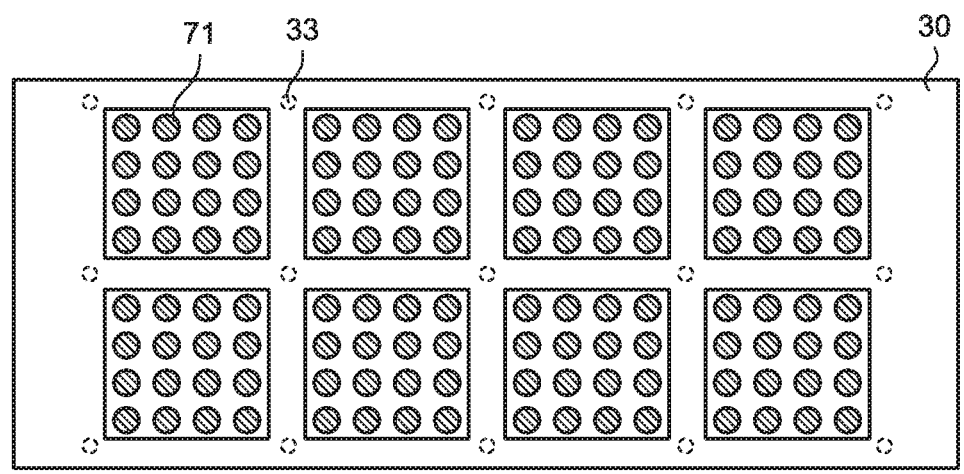

FIGS. 3A and 3B are diagrams illustrating an example of the IC tray in a state where IC packages are mounted thereon. FIG. 3A is a top view, and FIG. 3B is a bottom view. In FIGS. 3A and 3B, hatching is given to the IC packages 70 for the sake of easy viewing. As illustrated in FIGS. 3A and 3B, when the IC packages 70 are mounted on the IC package mounting places 35 on the IC tray 30, the peripheral portion of the lower face of each IC package 70 is supported by the support portion 321. Further, the respective terminals 71 provided on the lower face of the IC package 70 are fitted in the through-holes 31.

As illustrated in FIG. 2B, guide holes 33 are provided on the lower face side, below the protruding portions 32, correspondingly to the guide pins 14 of the test board 10. The diameter of each guide hole 33 is set slightly larger than the diameter of each guide pin 14 to allow the guide pin 14 to be fitted in the guide hole 33.

The IC tray 30 is made of a hard material that can be scarcely deformed by temperature changes. For example, the IC tray 30 is made of a metal material, ceramic material, resin material, or the like. Where the IC tray 30 is made of an electrically conductive material, the upper surface and lower surface of the IC tray 30 and the inner surface of the through-holes 31 are coated with an insulating material.

Figure 4:
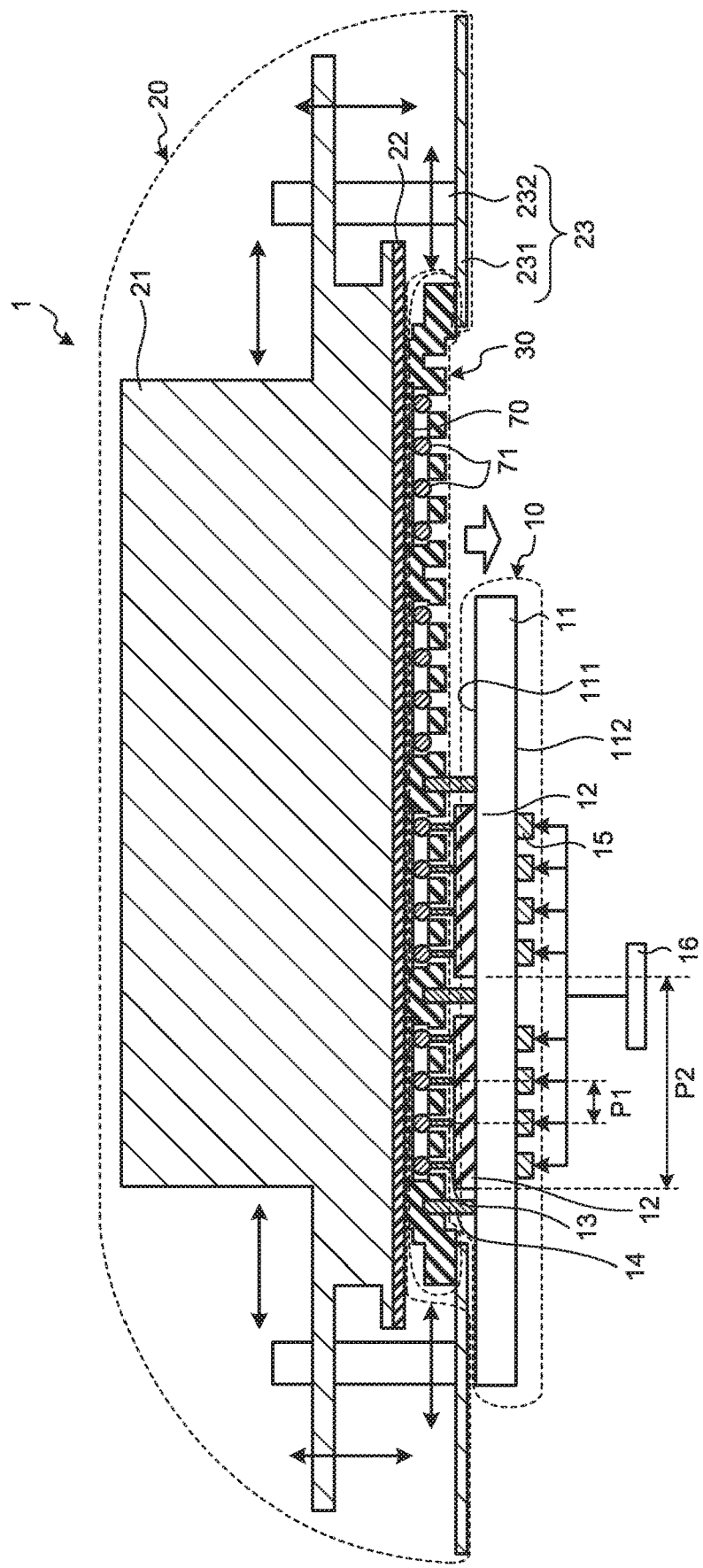
FIG. 4 is a diagram schematically illustrating a state where a test is performed to the IC tray according to the first embodiment by using the test jig.

Next, an explanation will be given of a test method for IC packages performed by using the IC tray 30 and the test jig 1 described above. FIG. 4 is a diagram schematically illustrating a state where a test is performed to the IC tray according to the first embodiment by using the test jig. First, IC packages 70 are mounted on the IC package mounting places 35 of the IC tray 30. Here, an IC package 70 may be mounted on every one of the IC package mounting places 35, or an IC package 70 may not be mounted on some of the IC package mounting places 35.

Then, the IC tray 30 including the IC packages 70 mounted thereon is supported by the tray transfer mechanism 20. For example, while the head 21 is set in contact with the upper face of the tray 30 through the pad 22, the peripheral portion of the lower face of the IC tray 30 is held by the holding portions 231 from below.

Thereafter, the IC tray 30 is transferred by the tray transfer mechanism 20 to the position of the test board 10, and alignment is performed to set the positions of the guide holes 33 on the lower face of the IC tray 30 to overlap with the positions of the guide pins 14 of the test board 10. After the alignment is performed between the guide pins 14 and the guide holes 33, the tray transfer mechanism 20 is lowered. As illustrated in FIG. 1, as the guide pins 14 are fitted in the guide holes 33, the positions of the through-holes 31 of the IC tray 30 agree with the positions of the test pins 13 of the test board 10, and the test pins 13 of the test board 10 come into contact with the terminals 71 of the IC packages 70.

Then, as illustrated in FIG. 4, the tray transfer mechanism 20 is lowered to apply a predetermined force to the respective test pins 13 set in contact with the terminals 71. In this state, an electrical test is performed to the IC packages 70. In a sectional view of the example of FIG. 4, two support tables 12 are arranged, and four IC packages 70 are mounted on the IC tray 30. Specifically, FIG. 4 illustrates a state where the two IC packages 70 on the left side of the four IC packages 70 are being tested, and the two IC packages 70 on the right side are not being tested.

Accordingly, the IC tray 30 is transferred by the tray transfer mechanism 20 such that, after the test to the two IC packages 70 on the left side is finished, the test to the two IC packages 70 on the right side is performed. In this case, the tray transfer mechanism 20 transfers the IC tray 30 to shift the IC tray 30 by a degree corresponding to the size of the two IC packages 70. Then, as described above, the guide holes 33 present around the two IC packages 70 on the right side are set to agree with the positions of the guide pins 14 of the test board 10, and then the tray transfer mechanism 20 is lowered to push the IC packages 70 to the test pins 13.

In this state, the test is performed to the IC packages 70. Then, after the test is finished to all the IC packages 70 mounted on the IC tray 30, the IC tray 30 is transferred to a predetermined place. Thereafter, a test is performed to subsequent IC packages 70 mounted on an IC tray 30.

Figure 5A:
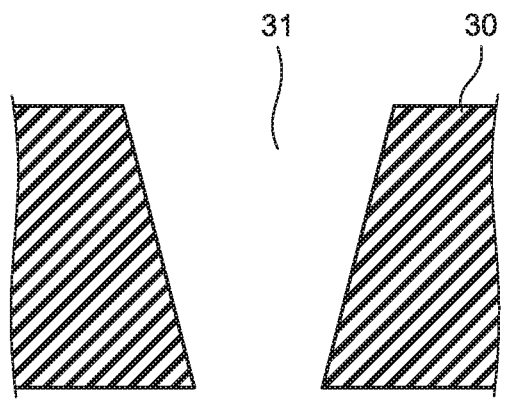
FIGS. 5A and 5B are sectional views schematically illustrating examples of a through-hole in the IC tray according to the first embodiment.
Figure 5B:
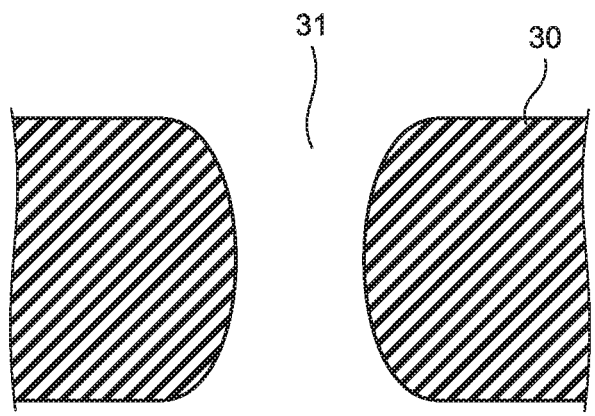

In the example described above, the diameter of each through-hole 31 formed in the IC tray 30 is constant in the thickness direction; however, the diameter may be made not constant. FIGS. 5A and 5B are sectional views schematically illustrating examples of the through-hole in the IC tray according to the first embodiment. As illustrated in FIG. 5A, each through-hole 31 may be formed with a diameter that becomes smaller from the upper face side, into which a terminal 71 is fitted, toward the lower face side. Here, the upper face of the IC tray 30 corresponds to a first face, and the lower face corresponds to a second face. In this case, the through-hole 31 can receive a terminal 71 of an IC package 70 more easily. Further, even if the size of the terminal 71 varies, or the arrangement position of the terminal 71 is mismatched, the through-hole 31 can receive the terminal 71 by an amount of play thus provided.

Alternatively, as illustrated in FIG. 5B, each through-hole 31 may be formed with a diameter that becomes larger from about the center of the IC tray 30 in the thickness direction toward the lower face side and the upper face side. In this case, the diameter of the through-hole 31 becomes larger also on the lower face side, and thus can provide a play for a test pin 13 to be inserted.

Figure 6:
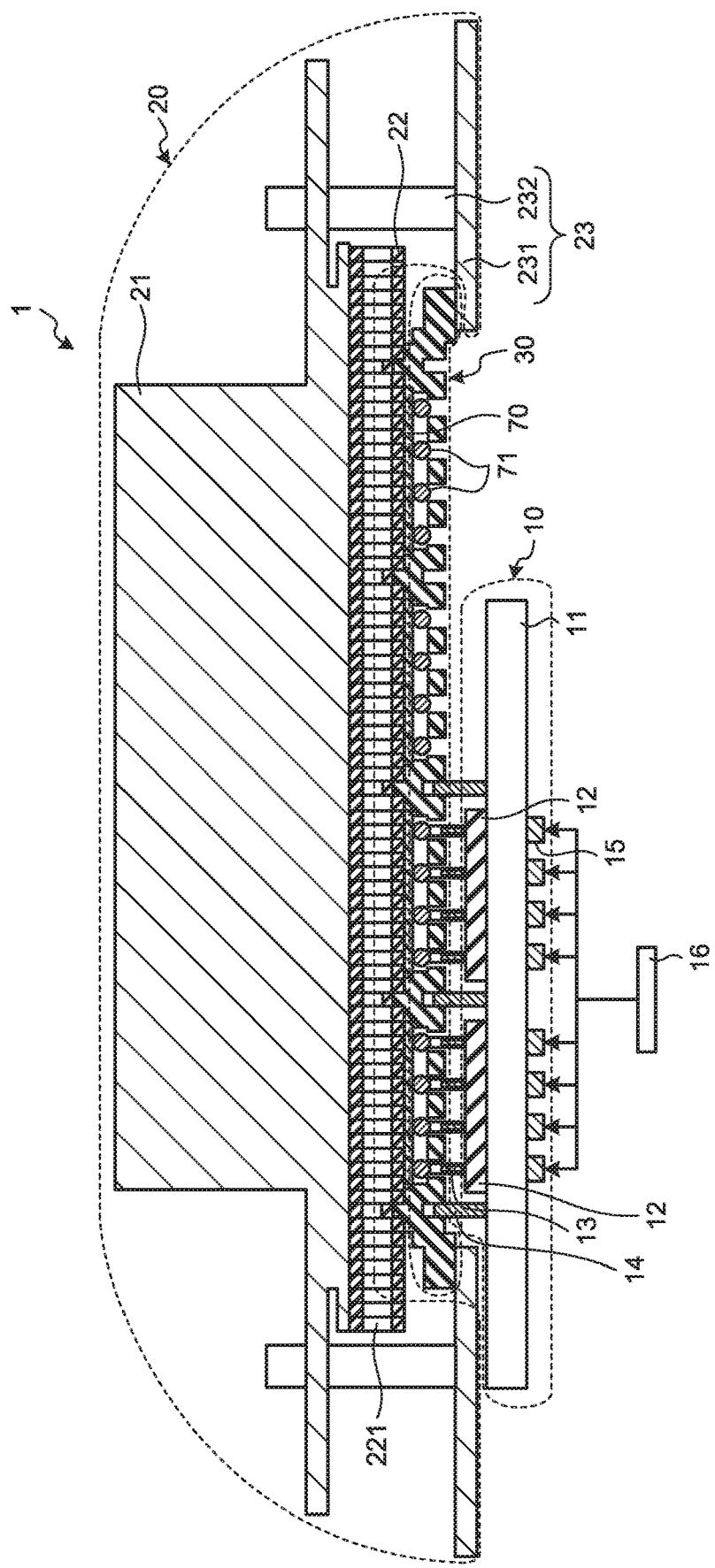
FIG. 6 is a diagram schematically illustrating another configuration example of a test jig including the IC tray according to the first embodiment.

Further, FIG. 1 illustrates an example where the head 21 of the tray transfer mechanism 20 comes into contact with the IC tray 30 through the pad 22; however, the embodiment is not limited to this example. FIG. 6 is a diagram schematically illustrating another configuration example of a test jig including the IC tray according to the first embodiment. Here, the constituent elements corresponding to those illustrated in FIG. 1 are denoted by the same reference symbols, and their description will be omitted.

In this example, a pad 22 is composed of a plurality of push pins 221 bedded all over the lower side of the head 21. Each of the push pins 221 is a spring-equipped pin, which can extend and contract in the vertical direction. Here, the push pins 221 can contract in accordance with the unevenness of the upper face of the IC tray including IC packages 70 mounted thereon, when the IC tray is supported by the tray transfer mechanism 20. According to this arrangement, even if the unevenness of the upper face of the IC tray is various because of a difference in specifications between IC packages 70, or an IC package 70 is placed at a deeper position, the IC packages 70 can be pressed by a common pad 22 regardless of the type of IC package 70.

Further, in the above description, the IC tray 30 has been explained as including the IC package mounting places 35 larger in number than the support tables 12 on the test board 10. However, an IC tray 30 may be employed that includes the IC package mounting places 35 the same in number as the support tables 12 on the test board 10.

In the first embodiment, the IC tray 30 is provided with the through-holes 31 correspondingly to the arrangement positions of the terminals 71 of test object IC packages 70. With this arrangement, after IC packages 70 are mounted on the IC tray 30, the IC tray 30 is moved together with the IC packages 70 as a whole to the test board 10, and then the terminals 71 of the IC packages 70 on the IC tray 30 are brought into contact with the test pins 13 of the test board 10. As a result, as compared with a method of moving IC packages 70 to an IC socket one by one and performing a test thereto, a test to IC packages 70 can be simplified. Further, as the IC tray 30 is transferred together with the IC packages 70 as a whole to the test jig 1, the test time can be shortened, as compared with a case of transferring IC packages 70 to an IC socket one by one. Further, the IC tray 30 can be prepared not for every type of specifications of the IC package 70, such as the size, but for every type of arrangement positions and pitch of the terminals 71 of the IC package 70. Thus, the same IC tray can be used to transfer and test IC packages 70 different in type but including terminals 71 of the same arrangement positions and pitch. Further, the through-holes 31 can be used as a guide to perform alignment between the terminals 71 and the test pins 13.

Further, as the IC package mounting places 35 of the IC tray 30 are provided in accordance with the pitch of the support tables 12 on the test board 10, a test can be performed simultaneously to IC packages 70 the same in number as the support tables 12 on the test board 10.

Further, in the first embodiment, the test jig 1 includes the test board 10, the IC tray 30, and the tray transfer mechanism 20 configured to hold and transfer the IC tray. The IC tray 30 includes the IC package mounting places 35 provided in accordance with the pitch of the support tables 12 provided on the test board 10. The IC package mounting places 35 include through-holes 31 provided in accordance with the positions and pitch of the terminals 71 of IC packages 70. With this arrangement, the IC tray 30 including IC packages 70 mounted thereon can be transferred as a whole to the test board 10 and tested there. Thus, even if IC packages 70 are different in specifications, the connection component for the IC packages 70 with respect to the tray transfer mechanism 20 can be commonized, and thus a replacement operation of the connection component can be omitted. Further, as compared with a case of using an IC socket for every IC package 70, the pitch of IC packages 70 can be set smaller, and thus the number of IC packages 70 that can be tested together at a time can be increased. Further, the traveling distance for performing a test to subsequent IC packages 70 can be shorter. Further, after a test is finished, IC packages 70 can be returned in units of the IC tray 30, and thus the time necessary for the test can be shortened, as compared with a case of transferring each IC package 70 to an IC socket. As described above, as compared with a method of moving IC packages 70 to an IC socket one by one and performing a test thereto, a test to IC packages 70 can be simplified, and the time necessary for the test can be shortened.

Second Embodiment

In the first embodiment, the IC package mounting places are provided in units of a test object to be treated by the test board, and the IC package mounting places are provided with through-holes in accordance with the terminals of IC packages. Accordingly, the IC tray has to be prepared for every combination of the number and pitch of the terminals of IC packages. In the second embodiment, an explanation will be given of an IC tray and a test jig, which can be commonly used for IC packages different in the number of terminals as long as the IC packages are the same in the pitch of the terminals. Here, the constituent elements corresponding to those of the first embodiment are denoted by the same reference symbols, and their description will be omitted.

Figure 7A:
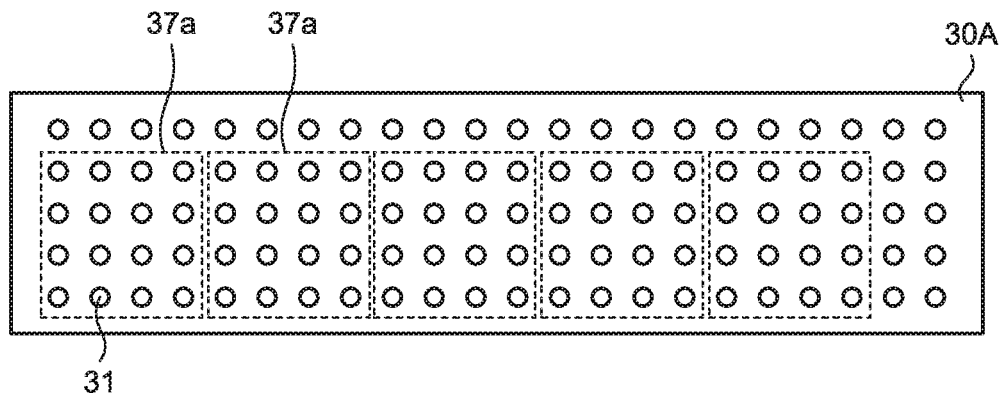
FIGS. 7A and 7B are top views illustrating a configuration example of an IC tray according to a second embodiment.
Figure 7B:
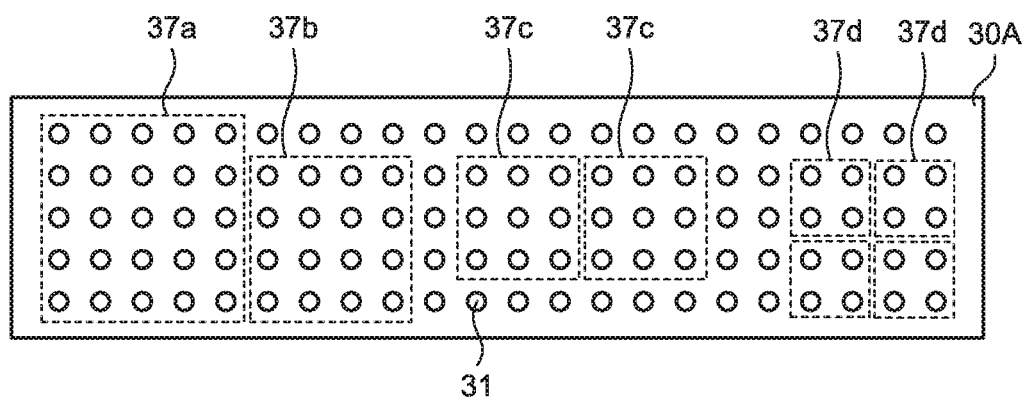

FIGS. 7A and 7B are top views illustrating a configuration example of an IC tray according to the second embodiment. Overall the IC tray 30A according to the second embodiment, through-holes 31 are formed at a pitch equal to that of the terminals of test object IC packages. Further, unlike the first embodiment, no IC package mounting places 35 are provided. Accordingly, for example, when IC packages sizes as illustrated in FIG. 1 are to be tested, positions 37a for placing the IC packages are set, as illustrated in FIG. 7A, so that the IC packages can be mounted on the IC tray 30A in a state denser than the case of FIG. 2A.

Further, as illustrated in FIG. 7B, in one IC tray 30A, placement positions 37a to 37d can be set for IC packages of a plurality of types, which are the same in terminal pitch and different in size. Here, the size and number of placement positions are not limited to these examples.

Figure 8:
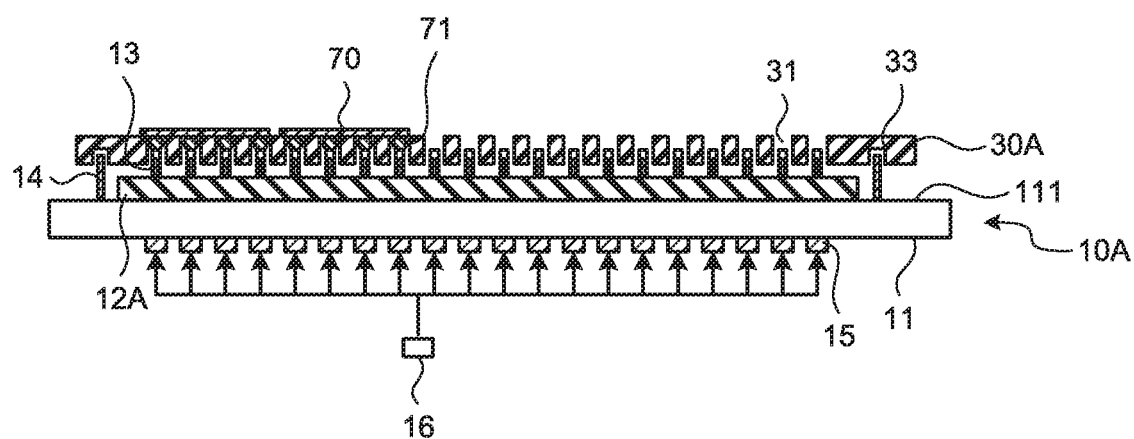
FIG. 8 is a sectional view illustrating part of a configuration example of a test jig using the IC tray according to the second embodiment.

FIG. 8 is a sectional view illustrating part of a configuration example of a test jig using the IC tray according to the second embodiment. Here, FIG. 8 illustrates only a test board 10A and the IC tray 30A in the test jig 1. The other parts are substantially the same as those of FIG. 1.

As illustrated in FIG. 8, the test board 10A according to the second embodiment is provided with one support table 12A on the upper face 111 of the base plate 11. For example, the support table 12A is arranged to cover a region of the IC tray 30A smaller than the arrangement region of the through-holes 31. However, as an example, the support table 12A may be provided to cover all the arrangement region of the through-holes 31 of the IC tray 30A. Alternatively, as another example, the support table 12A may be provided to cover a region that has a dimension almost the same as the IC tray 30A in the long side direction and a dimension shorter than the IC tray 30A in the short side direction. Alternatively, the support table 12A may be provided to cover a region that has dimensions shorter than the IC tray 30A in the long side direction and the short side direction. In these cases, the guide holes 33 are preferably not provided. The support table 12A is provided with test pins 13 in accordance with the positions and pitch of the through-holes 31 of the IC tray 30A. As in the first embodiment, the respective test pins 13 are individually connected to wiring lines, and the other ends of the respective wiring lines are connected to electrode pads 15. The electrode pads 15 are connected to a tester channel 16 of a tester. Further, guide pins 14 are arranged at predetermined positions around the support table 12A.

In the second embodiment, the IC tray 30A has a structure in the form of a flat plate. As described above, the IC tray 30A is provided with the through-holes 31 in accordance with the pitch of the terminals 71 of test object IC packages 70. This arrangement is adopted so that IC packages 70 of a plurality of types can be simultaneously mounted, which are the same in the pitch of terminals 71 and different in size or the like. Further, the IC tray 30A is provided with guide holes 33 on the lower face of the peripheral portion. The guide holes 33 are used to perform alignment when the IC tray 30A is mounted on the test board 10A.

As illustrated in FIGS. 7A and 7B, IC packages different in type are placed at arbitrary positions on the IC tray 30A. Accordingly, the tester (not illustrated) including the tester channel 16 performs a test, in accordance with the placement positions of the IC packages 70 on the IC tray 30A, by using a program set to supply an electric power and/or a signal to the terminals 71.

The test method performed in the test jig is substantially the same as that explained in the first embodiment, and thus its description will be omitted.

In the second embodiment, the through-holes 31 are formed at a pitch equal to the pitch of the terminals of test object IC packages, in a predetermined region of the IC tray 30A like a flat plate. With this arrangement, a test can be performed while the test object IC packages are mounted in the densest state on the IC tray 30A, without depending on the pitch of the support tables 12 on the test board 10.

Further, the IC tray 30A can be commonly used for IC packages different in size, i.e., different in type, as long as the IC packages have a terminal pitch equal to the pitch of the through-holes 31 provided in the IC tray 30A. Further, a test can be performed while IC packages different in type are mounted on one IC tray 30A.

In test jig according to the second embodiment, the support table 12A is provided on the upper face 111 of the base plate 11 to cover all the through-holes 31 of the IC tray 30A, and the test pins 13 are provided on the support table 12A correspondingly to the through-holes 31. Thus, a test can be performed to IC packages regardless of the size, as long as the IC packages include terminals 71 having a pitch equal to that of the test pins 13. For example, IC packages of a plurality of types different in size can be mounted on the IC tray 30A and simultaneously tested.

Further, when IC packages are mounted in a denser state on the IC tray 30A, the distance between the test object IC packages becomes shorter, and thus the difference in wiring line length on the test board 10A can be relatively smaller, as compared to the first embodiment.

Third Embodiment

In the third embodiment, an explanation will be given of a case where an IC tray including IC packages mounted thereon is combined with another IC tray of the same type stacked thereon, and the IC packages are transferred and tested in this state.

Figure 10A:
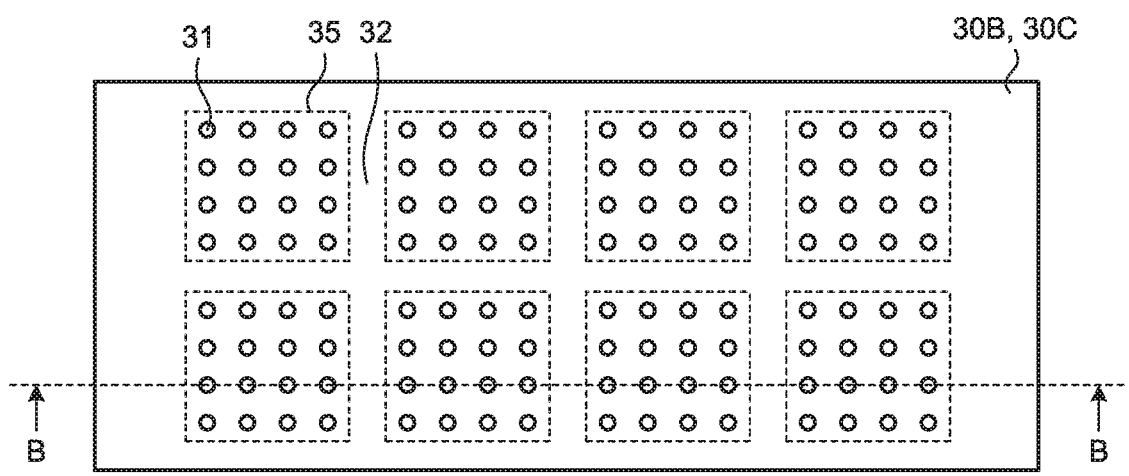
FIGS. 10A and 10B are diagrams illustrating a configuration example of a lid of the IC tray according to the third embodiment.
Figure 10B:
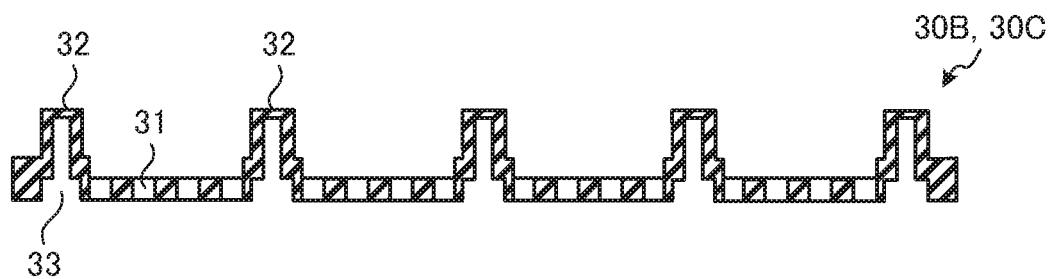

FIG. 9 is a diagram schematically illustrating a configuration example of a test jig including an IC tray according to the third embodiment. FIGS. 10A and 10B are diagrams illustrating a configuration example of a lid of the IC tray according to the third embodiment. FIG. 10A is a top view, and FIG. 10B is a sectional view taken along a line B-B of FIG. 10A. Here, the constituent elements corresponding to those of the first embodiment are denoted by the same reference symbols, and their description will be omitted.

A tray transfer mechanism 20B according to the third embodiment is configured to hold the lateral sides of an IC tray 30B covered with a lid 30C on the upper face side. The tray transfer mechanism 20 includes a head 21 and gripping members 23.

Each of the gripping members 23 includes a holding portion 233 and an arm 234. In a state where the upper face of the lid 30C put over the IC tray 30B is set in contact with the head 21 and the arms 234, the gripping members 23 come into contact with the lateral sides of the stack of the IC tray 30B with the lid 30C to hold the IC tray 30B and the lid 30C. The holding portions 233 are supported by the head 21 through the arms 234. Further, the arms 234 serve to press the upper face of the lid 30C that covers the IC tray 30B, in the regions between the head 21 and the holding portions 233. Each of the arms 234 is configured to be movable in the horizontal direction.

In the third embodiment, the IC tray 30B is set in a state covered with the lid 30C, and is transferred by the arms of the handler device, when a test is to be performed to the IC tray 30B. The IC tray 30B has a configuration almost the same as that explained with reference to FIGS. 2A and 2B.

However, the position of the upper side of the protruding portions 32 is set to be the same as or lower than the position of the upper faces of the IC packages 70 in a state where the IC packages 70 are mounted. Further, the lid 30C has a configuration the same as that of the IC tray 30B. As illustrated in FIGS. 9, 10A, and 10B, alignment is performed such that the protruding portions 32 of the IC tray 30B are to be fitted into the guide holes 33 of the lid 30C, and then the lid 30C, which has the same configuration as the IC tray 30B, is put over the upper face of the IC tray 30B including IC packages 70 mounted thereon, so that the upper faces of the IC packages 70 are secured. Here, unlike the first embodiment, as illustrated in FIGS. 10A and 10B, the guide holes 33 are provided on the lower face side, below the protruding portions 32 that demarcate the IC package mounting places 35, correspondingly to the positions of the protruding portions 32. The guide holes 33 are set in a size with which the protruding portions 32 of the IC tray 30B can be fitted in. As the protruding portions 32 of the IC tray 30B and the lid 30C are arranged to demarcate the rectangular IC package mounting places 35, the guide holes 33 are shaped like grooves. However, the guide holes 33 may be not necessarily shaped like grooves. For example, guide holes 33 shaped like circular columns or prismatic columns may be provided at predetermined positions on the lower face side below the protruding portions 32.

A test method performed to IC packages 70 in the test jig according to the third embodiment is essentially the same as that explained in the first embodiment. Thus, here, an explanation will be given of that part of a test method which is different from the first embodiment. As illustrated in FIG. 9, IC packages 70 are mounted on the IC tray 30B, and the lid 30C is put over the IC tray 30B. At this time, alignment is performed between the protruding portions 32 of the IC tray 30B and the guide holes 33 of the lid 30C, and then the lid 30C is put over the upper face side of the IC tray 30B. Consequently, the IC packages 70 are secured by the IC tray 30B and the lid 30C. Thereafter, while gripping the IC tray 30B covered with the lid 30C by the gripping members 23, the tray transfer mechanism 20B transfers the IC tray 30B above the test board 10.

In third embodiment, a test is performed while the upper face of the IC tray 30B including IC packages 70 mounted thereon is covered with the lid 30C configured to press the upper faces of the IC packages 70. Consequently, when the IC tray 30B is pushed toward the test board 10 during the test, the IC packages 70 are not shifted upward, and thus the terminals 71 of the IC packages 70 can be held in electric contact with the test pins 13. Further, even if the upper face of the IC tray 30 has unevenness, a test can be performed by using the simplified test jig 1 including the pad 22 as illustrated in FIG. 1, without using the test jig 1 having a complicated structure including the plurality of push pins 221 as illustrated in FIG. 6.

Fourth Embodiment

In the first to third embodiments, an explanation has been given of an example where the terminals of IC packages are of the BGA type. In the fourth embodiment, an explanation will be given of a case where the terminals of IC packages are of the Quad Flat Package (QFP) type.

Figure 11:
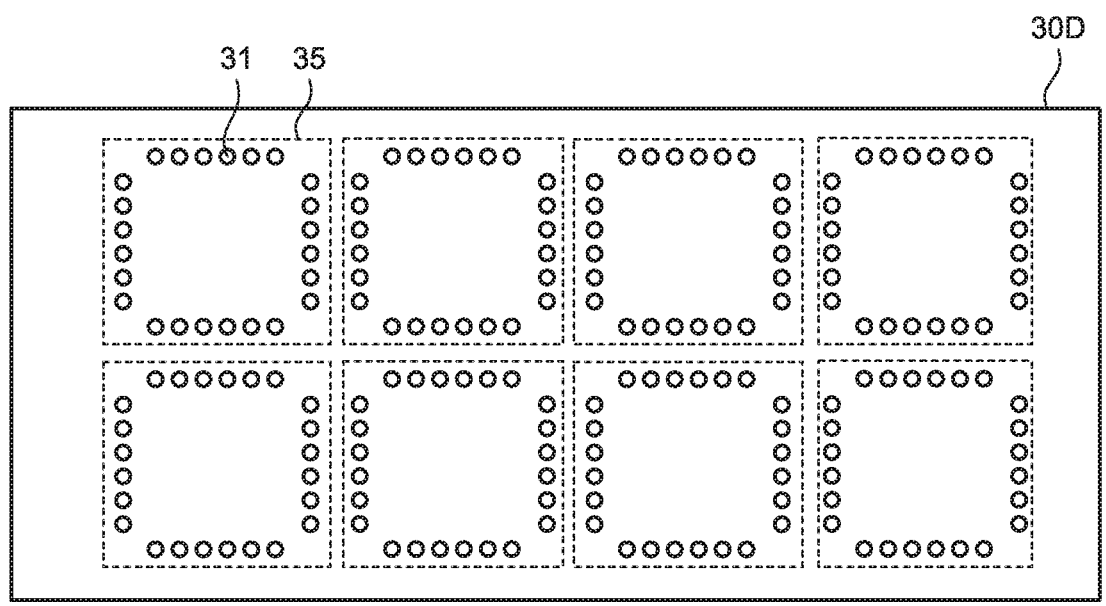
FIG. 11 is a top view schematically illustrating an example of an IC tray according to a fourth embodiment.

FIG. 11 is a top view schematically illustrating an example of an IC tray according to the fourth embodiment. The IC tray 30D is provided with IC package mounting places 35, and through-holes 31 are provided along the peripheral portions of the IC package mounting places 35. The through-holes 31 are provided correspondingly to the positions of lead frames serving as the terminals of IC packages to be mounted on the IC package mounting places 35. Here, the other constituent elements are substantially the same as those explained in the first embodiment, and thus their description will be omitted.

Further, the IC tray 30D may be combined with a lid that can press lead frames, as explained in the third embodiment, to prevent the lead frames from being shifted upward by a force applied from the test pins 13 during a test.

Also in the fourth embodiment, substantially the same effects as in the first and third embodiments can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A test jig comprising:
    an IC tray mounting thereon IC packages to be tested;
    a test board that includes support tables and electrode pads, the support tables being provided with test pins to be in contact with terminals of the IC packages mounted on the IC tray, the electrode pads being connected to the test pins through wiring lines; and
    a tray transfer mechanism configured to grip the IC tray while pressing through a pad a first face of the IC tray on which the IC packages are to be mounted, and to transfer the IC tray to the test board, wherein
    the IC tray includes
        a plurality of through-holes provided at a pitch equal to a pitch of terminals of the IC packages, and
        IC package mounting places on which the IC packages are to be mounted, and
    the through-holes are provided in the IC package mounting places correspondingly to arrangement positions of the terminals of the IC packages, and
    a plurality of test pins of the test board used for an electrical test to one of the IC packages are provided correspondingly to the IC package mounting places.

2. The test jig according to claim 1, wherein
    the IC packages are BGA IC packages in which the terminals are solder balls, and
    the test pins of the test board and the through-holes of the IC tray are provided in accordance with arrangement positions of the solder balls.

3. The test jig according to claim 1, wherein
    the IC packages are QFP IC packages in which the terminals are lead frames, and
    the test pins of the test board and the through-holes of the IC tray are provided in accordance with arrangement positions of the lead frames.

4. The test jig according to claim 1, wherein the through-holes of the IC tray have a diameter that is constant from the first face to a second face opposite to the first face.

5. The test jig according to claim 1, wherein the through-holes of the IC tray have a diameter that becomes smaller from the first face toward a second face opposite to the first face.

6. The test jig according to claim 1, wherein the through-holes of the IC tray have a diameter that becomes larger from about a center of the IC tray in a thickness direction toward the first face of the IC tray and a second face opposite to the first face.

\* \* \* \* \*